(12) United States Patent  
Yang et al.

(10) Patent No.: US 8,963,594 B2  
(45) Date of Patent: Feb. 24, 2015

(54) PHASE-LOCKED LOOP CIRCUIT

(71) Applicant: Realtek Semiconductor Corporation, Hsinchu (TW)

(72) Inventors: Yu-Che Yang, Sanxing Township (TW); Han-Chang Kang, Hsinchu (TW)

(73) Assignee: Realtek Semiconductor Corporation, Hsinchu (TW)

( * ) Notice: Subject to any disclaimer, the term of this patent is extended or adjusted under 35 U.S.C. 154(b) by 5 days.

(21) Appl. No.: 13/892,082

(22) Filed: May 10, 2013

(65) Prior Publication Data

US 2013/0300471 A1    Nov. 14, 2013

(30) Foreign Application Priority Data

May 11, 2012    (TW) .............................. 101116838 A

(51) Int. Cl.
*H03L 7/08* (2006.01)
*H03L 7/00* (2006.01)
*H03L 7/089* (2006.01)
*H03L 7/093* (2006.01)

(52) U.S. Cl.
CPC ................ *H03L 7/00* (2013.01); *H03L 7/0893* (2013.01); *H03L 7/093* (2013.01)
USPC ............. 327/157; 327/148; 327/156; 331/17; 375/376

(58) Field of Classification Search
CPC ........... H03L 7/08; H03L 7/085; H03L 7/089; H03L 7/0891; H03L 7/0895; H03L 7/0898; H03L 7/093
USPC .................... 327/147, 148, 156, 157; 331/17; 375/374, 376
See application file for complete search history.

(56) References Cited

U.S. PATENT DOCUMENTS

| | | | | |
|---|---|---|---|---|
| 6,963,232 | B2 * | 11/2005 | Frans et al. .................. | 327/156 |
| 7,019,571 | B2 * | 3/2006 | Lim .............................. | 327/157 |
| 7,030,688 | B2 * | 4/2006 | Dosho et al. ................. | 327/558 |
| 8,040,191 | B2 * | 10/2011 | Hirai ............................. | 331/16 |
| 2005/0280453 | A1 * | 12/2005 | Hsieh ........................... | 327/156 |

\* cited by examiner

*Primary Examiner* — Patrick O'Neill
(74) *Attorney, Agent, or Firm* — Christensen Fonder P.A.

(57) ABSTRACT

A phase-locked loop (PLL) circuit is provided. The PLL circuit includes a phase frequency detector (PFD), a first charge pump (CP), a second CP, a first loop component set, a second loop component set, a voltage control oscillator (VCO) and a frequency divider. The first CP and the second CP are coupled to the PFD. The first loop component set is coupled between the first CP and the VCO. The second loop component set is coupled between the second CP and the VCO. The frequency divider is coupled between the PFD and the VCO. The first loop component set generates an offset current to adjust the working range of the first CP and the second CP. The second loop component set generates an offset current and a DC adjustment voltage to control the control voltage outputted to the VCO.

12 Claims, 4 Drawing Sheets

PHASE-LOCKED LOOP CIRCUIT

This application claims the benefit of priority based on Taiwan Patent Application No. 101116838 filed on May 11, 2012, which is hereby incorporated by reference in its entirety.

CROSS-REFERENCES TO RELATED APPLICATIONS

Not applicable.

BACKGROUND OF THE INVENTION

1. Field of the Invention

The present invention relates to a phase-locked loop (PLL) circuit, and more particularly, to a dual-loop PLL circuit with offset currents.

2. Descriptions of the Related Art

Over recent years, in place of conventional single-loop designs, the dual-loop design is adopted in most phase-locked loop (PLL) circuits to reduce the area occupied by capacitors (the loop components of the PLL circuits). However, PLL circuits of the dual-loop design still have a problem in which charge pumps (CPs) thereof cannot effectively operate within a desired linear working range and consequently cause a spurious tone. On the other hand, control voltages that are outputted by the loops to a voltage control oscillator (VCO) vary significantly and continuously as the PLL circuits operate, so the VCO cannot effectively keep operating within the working range which is more linear than other ranges.

In view of the above, it is important to provide a solution in the PLL circuits of the dual-loop design that can effectively make the CPs operate within a desired linear working range and that can further control the control voltages outputted to the VCO so that the VCO can also keep operating within a desired linear working range.

SUMMARY OF THE INVENTION

An objective of the present invention is to provide a phase-locked loop (PLL) circuit to solve the aforesaid problems. The PLL circuit of the present invention adopts dual loops. An offset current is generated in one of the loops to make charge pumps (CPs) operate within a desired linear working range, and another offset current and a direct current (DC) adjustment voltage are further generated in the other loop to control a control voltage outputted to a voltage control oscillator (VCO) so that the VCO also operates within the desired linear working range. In this way, the present invention can effectively reduce the spurious tone by making both the CPs and the VCO operate within the respective desired linear working range.

To achieve the aforesaid objective, the present invention discloses a phase-locked loop (PLL) circuit, which comprises a phase frequency detector, a first charge pump (CP), a first loop component set, a second CP, a second loop component set, a voltage control oscillator (VCO) and a frequency divider. The phase frequency detector is configured to generate a correction signal according to a reference signal and a feedback signal. The first CP, which is coupled to the phase frequency detector, is configured to generate a first current according to the correction signal. The first loop component set, which is coupled to the first CP, is configured to receive the first current and generate a first offset current so as to generate a first control voltage according to the first current and the first offset current. The second CP, which is coupled to the phase frequency detector, is configured to generate a second current according to the correction signal. The second loop component set, which is coupled to the second CP, is configured to receive the second current and generate a second offset current and a direct current (DC) adjustment voltage so as to generate a second control voltage according to the second current, the second offset current and the DC adjustment voltage. The VCO, which is coupled to the first loop component set and the second loop component set, is configured to receive the first control voltage and the second control voltage, and generate an oscillation signal according to the first control voltage and the second control voltage. The frequency divider, which is coupled to the VCO and the phase frequency detector, is configured to receive the oscillation signal and divide the oscillation signal to generate the feedback signal.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Figure 1:
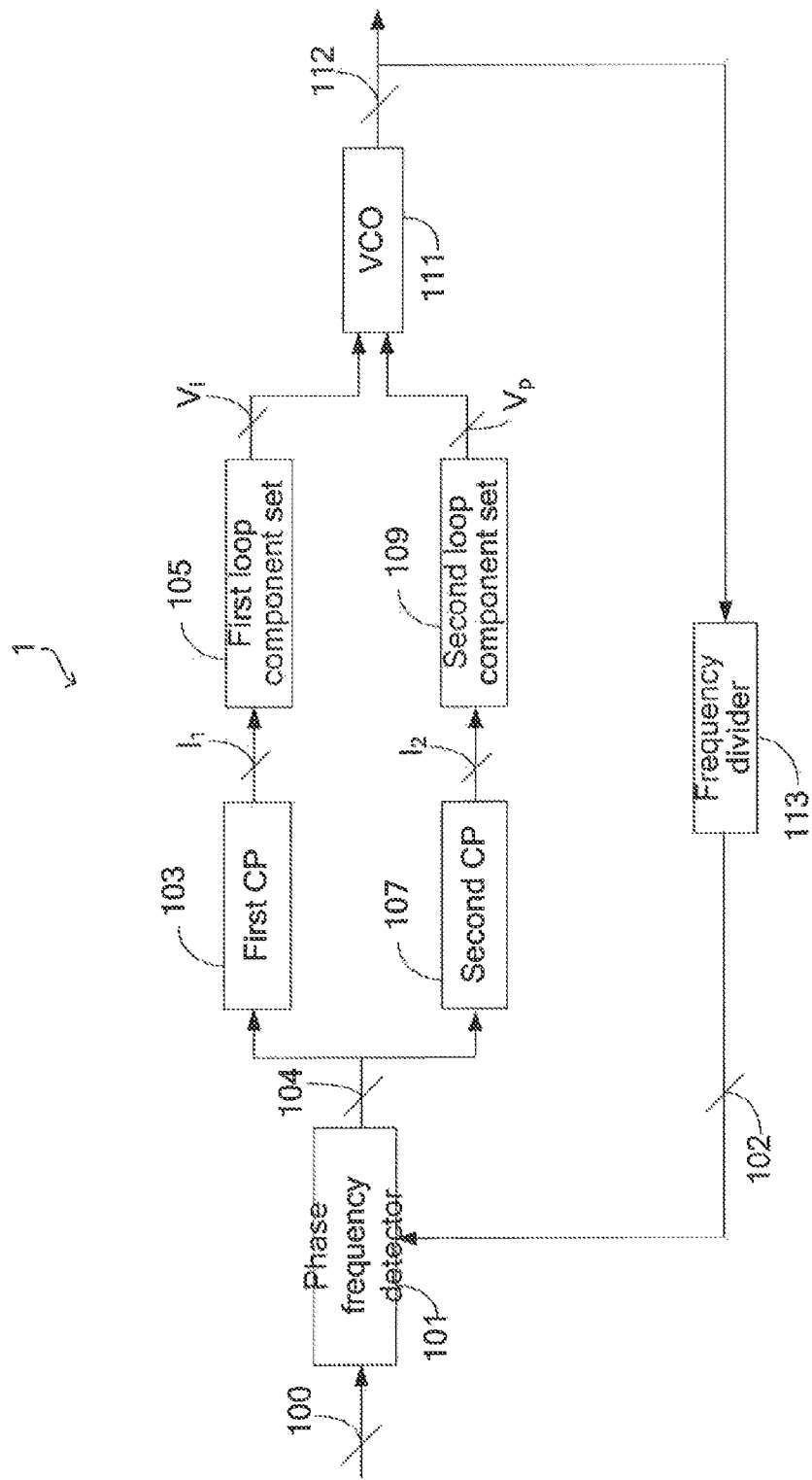
FIG. 1 is a schematic view of a PLL circuit 1 according to the first embodiment of the present invention.

An embodiment of the present invention is as shown in FIG. 1, which depicts a phase-locked loop (PLL) circuit 1. The PLL circuit 1 can be used in a radio frequency (RF) communication chip or any other chip for generating a specific high-frequency signal. The PLL circuit 1 comprises a phase frequency detector 101, a first charge pump (CP) 103, a first loop component set 105, a second CP 107, a second loop component set 109, a voltage control oscillator (VCO) 111 and a frequency divider 113.

The phase frequency detector 101 can, for example, receive a reference signal 100 from a crystal oscillator (not shown) and a feedback signal 102 from the frequency divider 113, and then generate a correction signal 104 according to the phase frequency difference between the reference signal 100 and the feedback signal 102. The first CP 103 and the second CP 107 are coupled to the phase frequency detector 101 respectively. After receiving the correction signal 104, the first CP 103 and the second CP 107 generate a first current $I_1$ and a second current $I_2$ according to the correction signal 104 respectively. The second current $I_2$ may be the first current $I_1$ multiplied by a proportional constant $\beta$, as shown by the formula 1.

$$I_2 = \beta I_1 \quad \text{(Formula 1)}$$

Specifically, the correction signal 104 comprises a charging signal and a discharging signal. The first current $I_1$ is a positive current when the first CP 103 receives the charging signal and is a negative current when the first CP 103 receives the discharging signal. Similarly, the second current $I_2$ is a positive current when the second CP 107 receives the charging signal and is a negative current when the second CP 107 receives the discharging signal. In other words, the first CP 103 and the second CP 107 generate the first current $I_1$ and the second current $I_2$ of different statuses according to the charging signal and the discharging signal comprised in the correction signal 104 respectively.

The first loop component set 105 is coupled to the first CP 103. The first loop component set 105 receives the first current $I_1$ and generates a first offset current (not shown) so as to generate a first control voltage $V_i$ according to the first current $I_1$ and the first offset current. The second loop component set 109 is coupled to the second CP 107. The second loop component set 109 receives the second current $I_2$ and further generates a second offset current (not shown) and a direct current (DC) adjustment voltage (not shown) so as to generate a second control voltage $V_p$ according to the second current $I_2$, the second offset current and the DC adjustment voltage. The first CP 103 and the first loop component set 105 constitute an integral path of the PLL circuit 1, while the second CP 107 and the second loop component set 109 constitute a proportional path of the PLL circuit 1.

Furthermore, the first loop component set 105 generates the first offset current continuously and invariably, while the second loop component set 109 generates the second offset current continuously and invariably. Through the adjustment of the magnitude of the first offset current, the response of the first CP 103 (i.e., the relationship between the phase frequency difference detected by the phase frequency detector 101 and the first current $I_1$ outputted by the first CP 103) and the response of the second CP 107 (i.e., the relationship between the phase frequency difference detected by the phase frequency detector 101 and the second current $I_2$ outputted by the second CP 107) can be adjusted. Therefore, when the PLL circuit 1 operates in a steady status, the first CP 103 and the second CP 107 can operate within respective desirable linear working ranges.

It shall be appreciated that when no correction signal 104 (i.e., the charging signal and the discharging signal) is provided by the phase frequency detector 101, the first CP 103 stops providing the first current $I_1$ and the second CP 107 stops providing the second current $I_2$. In this case, the first loop component set 105 generates the first control voltage $V_i$ according to only the first offset current, while the second loop component set 109 generates the second control voltage $V_p$ according to only the second offset current and the DC adjustment voltage.

The VCO 111 is coupled to the first loop component set 105 and the second loop component set 109, and receives the first control voltage $V_i$ and the second control voltage $V_p$. The VCO 111 generates an oscillation signal 112 according to the first control voltage $V_i$ and the second control voltage $V_p$. The second offset current and the DC adjustment voltage generated by the second loop component set 109 can be used to control the second control voltage $V_p$, so when the PLL circuit 1 operates in the steady status, the second control voltage $V_p$ is substantially controlled to be a constant value (i.e., it varies slightly, but the average value is substantially constant). The first control voltage $V_i$ is also controlled correspondingly. Thus, as compared to the prior art, the amplitudes of the variation of the first control voltage $V_i$ and the second control voltage $V_p$ of the PLL circuit 1 are controlled, so the VCO 111 of the present invention can operate within a relatively linear working range (in which the response of an output frequency to an input voltage of the VCO 111 has a desired linearity).

The frequency divider 113 is coupled to the VCO 111 and the phase frequency detector 101. The frequency divider 113 receives the oscillation signal 112, and divides the oscillation signal 112 to generate the feedback signal 102 of a low frequency. Furthermore, the frequency divider 113 may comprise a modulator (not shown), which is configured to change the divisor of the frequency divider 113. In this embodiment, the divisor of the frequency divider 113 is a fraction (i.e., the frequency divider 113 is a fraction type frequency divider); however, in other embodiments, the divisor of the frequency divider 113 may also be an integer (i.e., the frequency divider 113 is an integer type frequency divider). In some embodiments of the present invention, the PLL circuit 1 may also comprise no frequency divider.

Figure 2:
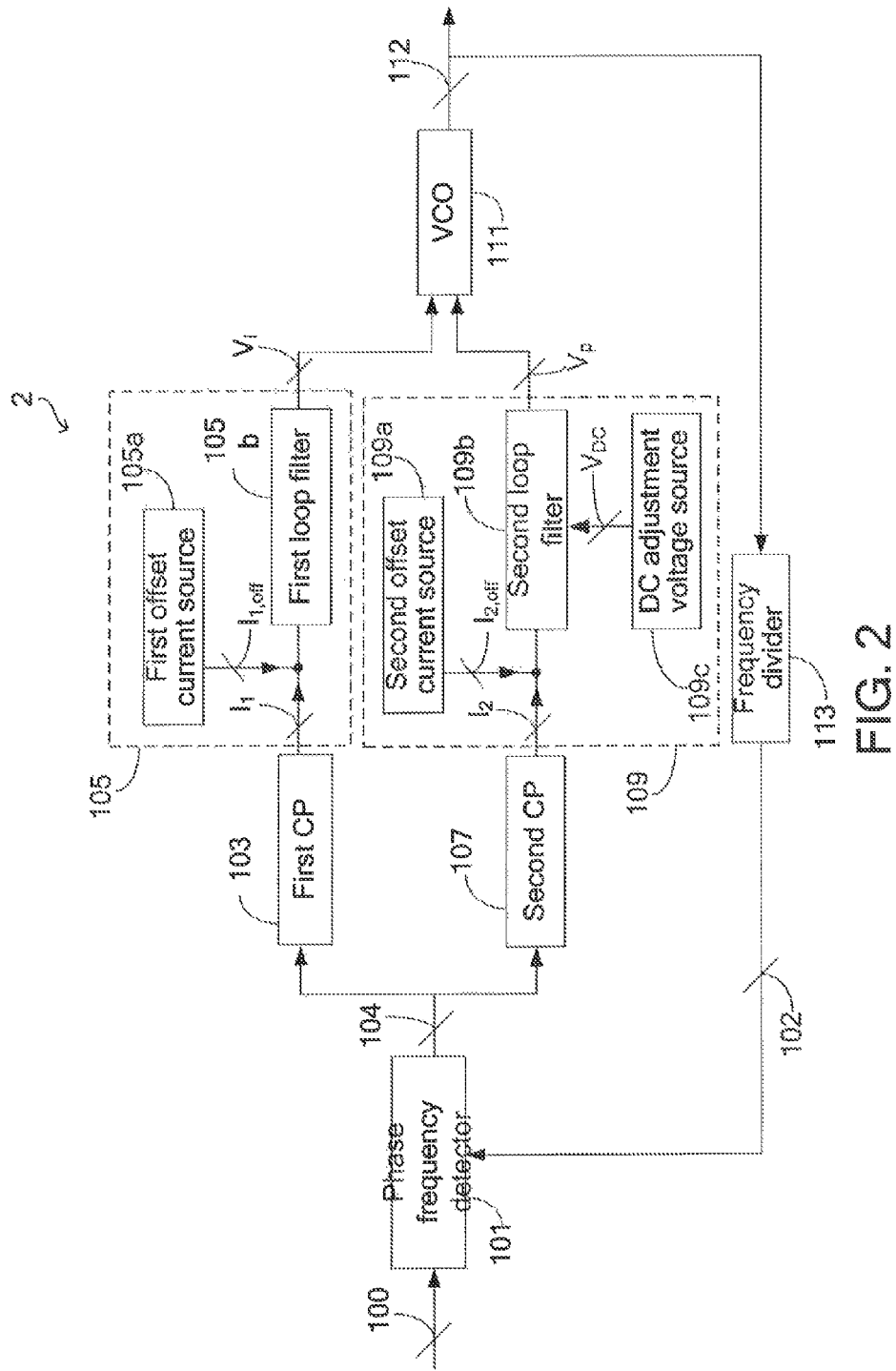
FIG. 2 is a schematic view of a PLL circuit 2 according to the second embodiment of the present invention.

The second embodiment of the present invention is as shown in FIG. 2, which depicts a PLL circuit 2. In this embodiment, the first loop component set 105 comprises a first offset current source 105a and a first loop filter 105b. The second loop component set 109 may comprise a second offset current source 109a, a second loop filter 109b and a DC adjustment voltage source 109c. The integral path comprises the first CP 103, the first offset current source 105a and the first loop filter 105b. The proportional path comprises the second CP 107, the second offset current source 109a, the second loop filter 109b and the DC adjustment voltage source 109c.

The first offset current source 105a generates the first offset current $I_{1,off}$. The first loop filter 105b is coupled to the first CP 103 and the first offset current source 105a. The first loop filter 105b receives the first current $I_1$ and the first offset current $I_{1,off}$, and generates the first control voltage $V_i$ according to the first current $I_1$ and the first offset current $I_{1,off}$. The second offset current source 109a generates the second offset current $I_{2,off}$, and the DC adjustment voltage source 109c generates the DC adjustment voltage $V_{DC}$. The second loop filter 109b is coupled to the second CP 107, the second offset current source 109a and the DC adjustment voltage source 109c. The second loop filter 109b receives the second current $I_2$ and the second offset current $I_{2,off}$, and generates the second control voltage $V_p$ according to the second current $I_2$, the second offset current $I_{2,off}$ and the DC adjustment voltage $V_{DC}$.

Figure 3:
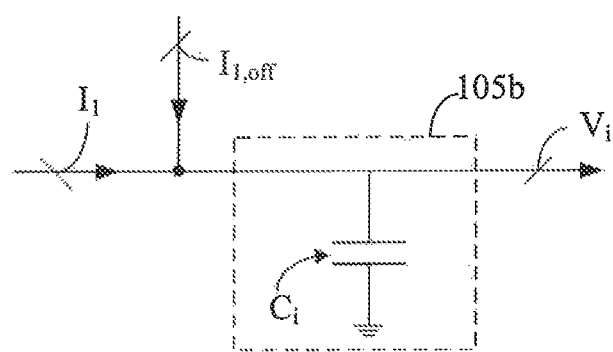
FIG. 3 is a schematic view of the first loop filter of the present invention.
Figure 4:
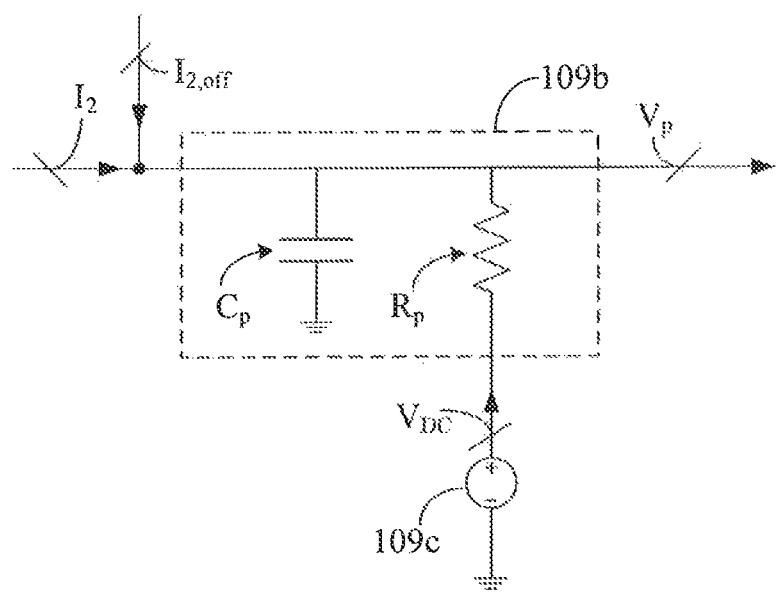
FIG. 4 is a schematic view of the second loop filter of the present invention.

FIGS. 3 and 4 illustrate schematic views of the first loop filter 105b and the second loop filter 109b respectively. The first loop filter 105b comprises an integral capacitor $C_i$. The second loop filter 109b comprises a proportional capacitor $C_p$ and a proportional resistor $R_p$. The DC adjustment voltage source 109c may be connected in series with the proportional resistor $R_p$ to input the DC adjustment voltage $V_{DC}$. The DC adjustment voltage source 109c may be a constant voltage or a ground potential (i.e., be grounded).

It shall be appreciated that an offset phase will be generated based on the ratio of the first offset current $I_{1,off}$ of the first offset current source 105a to the first current $I_1$ of the first CP 103 to increase the linearity of the PLL circuit (i.e., the first offset current $I_{1,off}$ and the first current $I_1$ can be set according to a desired offset phase). The first offset current $I_{1,off}$ generated by the first offset current source 105a also has an influence on the second control voltage $V_p$ of the proportional path so that the proportional path further has another equivalent offset current source (not shown), which generates an equivalent offset current as shown by the formula 2:

$$I_{eq2,off} = \beta I_1(-I_{1,off}/I_1) = -\beta I_{1,off} \qquad \text{(Formula 2)}$$

where $I_{eq2,off}$ represents the equivalent offset current. Accordingly, the second control voltage $V_p$ generated by the second loop filter 109b may be represented by the following formula 3:

$$V_p = V_{DC} + (I_{2,off} - \beta I_{1,off})R_p \qquad \text{(Formula 3)}$$

Furthermore, the relationship between the frequency of the oscillation signal 112, the first control voltage $V_i$ and the second control voltage $V_p$ may be represented by the following formula 4:

$$f_{VCO}=f_0+K_{VCO,p}V_p+K_{VCO,i}V_i \quad \text{(Formula 4)}$$

where $f_{VCO}$ represents the frequency of the oscillation signal 112, $f_0$ represents a central frequency of the VCO 111, $K_{VCO,i}$ represents a gain with respect to the first control voltage $V_i$, and $K_{VCO,p}$ represents a gain with respect to the second control voltage $V_p$.

Although the sum of the first control voltage $V_i$ and the second control voltage $V_p$ is a constant value, the first control voltage $V_i$ and the second control voltage $V_p$ vary continuously at a large amplitude as a PLL circuit operates. Therefore, the working range of the VCO cannot be controlled. The VCO cannot keep operating within a relatively linear working range. To overcome this problem, the PLL circuit 2 further comprises the second offset current source 109a and the DC adjustment voltage source 109c, while the second control voltage $V_p$ can be controlled by generating the second offset current $I_{2,off}$ and the DC adjustment voltage $V_{DC}$ (as shown by the formula 3). Therefore, when the PLL circuit 2 operates in the steady status, the second control voltage $V_p$ is substantially controlled to be a constant value.

According to the above descriptions, the PLL circuit of the present invention is provided with an offset current source to make the CPs operate within a linear working range, and this can reduce the spurious tone. Meanwhile, in the RF communication chip and the PLL circuit thereof of the present invention, an offset current source and a DC adjustment voltage source may further be provided to control the control voltage outputted to the VCO so that the VCO can keep operating within a desired linear working range. This can further reduce the spurious tone.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A phase-locked loop (PLL) circuit comprising:
    a phase frequency detector, being configured to generate a correction signal according to a reference signal and a feedback signal;
    a first charge pump (CP), being configured to generate a first current according to the correction signal;
    a first loop component set, being configured to generate a first offset current, and generate a first control voltage according to the first current and the first offset current;
    a second CP, being configured to generate a second current according to the correction signal;
    a second loop component set, being configured to generate a second offset current and a direct current (DC) adjustment voltage, and generate a second control voltage according to the second current, the second offset current and the DC adjustment voltage;
    a voltage control oscillator (VCO), being configured to generate an oscillation signal according to the first control voltage and the second control voltage; and
    a frequency divider, being configured to divide the oscillation signal to generate the feedback signal.

2. The phase-locked loop circuit as claimed in claim 1, wherein the first loop component set comprises:
    a first offset current source, being configured to generate the first offset current; and
    a first loop filter, being coupled to the first CP and the first offset current source, and being configured to receive the first current and the first offset current, and generate the first control voltage according to the first current and the first offset current.

3. The phase-locked loop circuit as claimed in claim 2, wherein the second loop component set comprises:
    a second offset current source, being configured to generate the second offset current;
    a DC adjustment voltage source, being configured to generate the DC adjustment voltage; and
    a second loop filter, being coupled to the second CP, the second offset current source and the DC adjustment voltage source, and being configured to receive the second current and the second offset current, and generate the second control voltage according to the second current, the second offset current and the DC adjustment voltage.

4. The phase-locked loop circuit as claimed in claim 3, wherein the first loop filter comprises an integral capacitor, the first CP, the first offset current source and the first loop filter constitute an integral path, the second loop filter comprises a proportional capacitor and a proportional resistor, and the second CP, the second offset current source, the DC adjustment voltage source and the second loop filter constitute a proportional path.

5. The phase-locked loop circuit as claimed in claim 1, wherein the second current is the first current multiplied by a proportional constant.

6. The phase-locked loop circuit as claimed in claim 1, wherein the second control voltage decreases as the first offset current increases.

7. The phase-locked loop circuit as claimed in claim 1, wherein the correction signal includes a charging signal and a discharging signal, the first current is a positive current when the first CP receives the charging signal and is a negative current when the first CP receives the discharging signal, and the second current is a positive current when the second CP receives the charging signal and is a negative current when the second CP receives the discharging signal.

8. The phase-locked loop circuit as claimed in claim 1, wherein the first offset current is set according to the first current and an offset phase.

9. A phase-locked loop circuit comprising:
    a phase frequency detector, being configured to generate a correction signal according to a reference signal and an oscillation signal;
    a first charge pump (CP), being configured to generate a first current according to the correction signal;
    a first loop component set, being configured to generate a first offset current, and generate a first control voltage according to the first current and the first offset current;
    a second CP, being configured to generate a second current according to the correction signal;
    a second loop component set, being configured to generate a second offset current and a DC adjustment voltage, and generate a second control voltage according to the second current, the second offset current and the DC adjustment voltage; and
    a voltage control oscillator (VCO), being configured to generate the oscillation signal according to the first control voltage and the second control voltage.

10. The phase-locked loop circuit as claimed in claim 9, wherein the second current is the first current multiplied by a proportional constant.

11. The phase-locked loop circuit as claimed in claim 9, wherein the second control voltage decreases as the first offset current increases.

12. The phase-locked loop circuit as claimed in claim 9, wherein the first offset current is set according to the first current and an offset phase.

* * * * *